United States Patent
Yoshida et al.

(10) Patent No.: US 10,208,247 B2
(45) Date of Patent: Feb. 19, 2019

(54) ALUMINATE FLUORESCENT MATERIAL, LIGHT EMITTING DEVICE USING THE SAME, AND METHOD OF PRODUCING ALUMINATE FLUORESCENT MATERIAL

(71) Applicant: NICHIA CORPORATION, Anan-shi, Tokushima (JP)

(72) Inventors: Tomokazu Yoshida, Anan (JP); Kazuya Nishimata, Anan (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/615,896

(22) Filed: Jun. 7, 2017

(65) Prior Publication Data

US 2017/0355904 A1    Dec. 14, 2017

(30) Foreign Application Priority Data

Jun. 9, 2016   (JP) .................................. 2016-115062
Mar. 21, 2017  (JP) .................................. 2017-054756

(51) Int. Cl.
  *C09K 11/57*   (2006.01)
  *C09K 11/64*   (2006.01)
  *H01L 33/50*   (2010.01)

(52) U.S. Cl.
  CPC .......... *C09K 11/643* (2013.01); *C09K 11/576* (2013.01); *H01L 33/502* (2013.01); *H01L 2224/48247* (2013.01); *H01L 2224/48257* (2013.01); *H01L 2224/73265* (2013.01)

(58) Field of Classification Search
  CPC ....... C09K 11/57; C09K 11/576; C09K 11/64; C09K 11/643; H01L 33/502
  See application file for complete search history.

(56) References Cited

U.S. PATENT DOCUMENTS 6,380,669 B1    4/2002   Zachau et al.
2010/0132789 A1  6/2010  Huang et al.

FOREIGN PATENT DOCUMENTS

| CN | 103849386 A | 6/2014 |
|----|---|---|
| EP | 0908502 A1 | 4/1999 |
| EP | 1480247 A1 | 11/2004 |
| JP | 2004-155907 * | 6/2004 |
| JP | 2004-155907 A | 6/2004 |
| JP | 2008-527151 A | 7/2008 |
| WO | 2007-037339 A1 | 4/2007 |

OTHER PUBLICATIONS

Translation for JP 2004-155907, Jun. 3, 2004.*
Extended European Search Report in EP application No. 17174766.0, dated Nov. 28, 2017. 6 pages.
Shinji Okamoto et al., "Photoluminescence Properties of BaMgAl0017 Dopes with High Concentration of Mn2+ for Blue-LED-Based Solid-State Lighting", Journal of the Electrochemical Society, 158(11), Jan. 1, 2011, pp. J363-J367.

* cited by examiner

*Primary Examiner* — C Melissa Koslow
(74) *Attorney, Agent, or Firm* — Hunton Andrews Kurth LLP (57) ABSTRACT

Provided is an aluminate fluorescent material having a high emission intensity and having a composition containing a first element that contains one or more of Ba and Sr, and a second element that contains Mg and Mn. In the composition, when a molar ratio of Al is 10, a total molar ratio of the first element is a parameter a, a total molar ratio of the second element is a parameter b, a molar ratio of Sr is a product of a parameter m and the parameter a, a molar ratio of Mn is a product of a parameter n and the parameter b. The parameters a and b satisfy $0.5 < b < a \leq 0.5b + 0.5 < 1.0$, the parameter m satisfies $0 \leq m \leq 1.0$, and the parameter n satisfies $0.4 \leq n \leq 0.7$.

5 Claims, 3 Drawing Sheets

ALUMINATE FLUORESCENT MATERIAL, LIGHT EMITTING DEVICE USING THE SAME, AND METHOD OF PRODUCING ALUMINATE FLUORESCENT MATERIAL

CROSS-REFERENCE TO RELATED APPLICATIONS

This application claims the benefit of Japanese Patent Application No. 2016-115062, filed on Jun. 9, 2016, and Japanese Patent Application No. 2017-054756, filed on Mar. 21, 2017, the disclosures of which are hereby incorporated by reference in their entirety.

BACKGROUND

Technical Field

The present invention relates to an aluminate fluorescent material, a light emitting device using the same, and a method of producing an aluminate fluorescent material.

Description of Related Art

Various light emitting devices that emit white light, bulb color light, orange light by combination of a light emitting diode (LED) and a fluorescent material have been developed. In these light emitting devices, a desired luminescent color can be obtained according to the principle of light color mixing. As a light emitting device that emits white light, a light emitting device using a light emitting element that emits blue color and a fluorescent material that emits yellow color is well known. The light emitting device using a light emitting element that emits blue color and a fluorescent material that emits yellow color or the like is desired to be used in a wide range of fields of general lighting, in-car lighting, displays, backlights for liquid crystals, etc. Among these, the fluorescent material for use in a light emitting device for backlights for liquid crystals is required to have a high color purity in addition to a high emission efficiency for reproducing colors in a broad range on the chromaticity coordinate system. In particular, the fluorescent material for use in a light emitting device for backlights for liquid crystals is desired to have a narrow full width at a half maximum (FWHM—hereinafter this is referred to as "half value width") of the emission peak in the emission spectrum thereof and to have a high color purity, from the viewpoint of realizing a broad color reproducibility range.

Japanese Unexamined Patent Publication No. 2004-155907 discloses a manganese-activated aluminate fluorescent material such as $(Ba, Sr)MgAl_{10}O_{17}:Mn^{2+}$ as a green emitting fluorescent material having a narrow half value width of the emission peak in the emission spectrum thereof. The manganese-activated aluminate fluorescent material disclosed in Japanese Unexamined Patent publication No. 2004-155907 is a fluorescent material that emits light when excited with vacuum UV rays having a wavelength in a range of 10 nm to 190 nm, specifically vacuum UV ray at 146 nm.

SUMMARY

However, the manganese-activated aluminate fluorescent material disclosed in Japanese Unexamined Patent Publication No. 2004-155907 is, when combined with a light emitting element that emits light having an emission peak wavelength in a range of 380 nm or more and 485 nm or less (hereinafter this may be referred to as "near-UV to blue region"), insufficient in emission intensity.

Consequently, an object of the present invention is to provide an aluminate fluorescent material capable of having a high emission intensity through photoexcitation in a near-UV to blue region, a light emitting device, and a method for producing an aluminate fluorescent material.

For solving the above-mentioned problem, the present disclosure includes the following aspects.

A first embodiment of the present disclosure relate to an aluminate fluorescent material having a composition containing a first element that contains one or more elements selected from Ba and Sr, and a second element that contains Mg and Mn, wherein in the composition of the aluminate fluorescent material, when a molar ratio of Al is taken as 10, a total molar ratio of the first element is a value of a parameter a, a total molar ratio of the second element is a value of a parameter b, a molar ratio of Sr is a product of a value of a parameter m and the value of the parameter a, a molar ratio of Mn is a product of a value of a parameter n and the value of the parameter b, the values of the parameters a and b satisfy the following requirement (1), the value of the parameter m satisfies the following requirement (2), and the value of the parameter n satisfies the following requirement (3):

$$0.5<b<a\leq 0.5b+0.5<1.0 \quad (1),$$

$$0\leq m\leq 1.0 \quad (2), \text{ and}$$

$$0.4\leq n\leq 0.7 \quad (3).$$

A second embodiment of the present disclosure relates to a light emitting device including the aluminate fluorescent material and an excitation light source.

A third embodiment of the present disclosure relate to a method of producing an aluminate fluorescent material, which includes mixing and heat-treating compounds that contain elements so as to provide a composition containing a first element that contains one or more elements selected from Ba and Sr, a second element that contains Mg and Mn, and Al and O, wherein in the composition, when a molar ratio of Al is taken as 10, a total molar ratio of the first element (Ba, Sr) is a value of a parameter a, a total molar ratio of the second element (Mg and Mn) is a value of a parameter b, a molar ratio of Sr is a product of a value of a parameter m and the value of the parameter a, a molar ratio of Mn is a product of a value of a parameter n and the value of the parameter b, the values of the parameters a and b satisfy the following requirement (1), the value of the parameter m satisfies the following requirement (2), and the value of the parameter n satisfies the following requirement (3):

$$0.5<b<a\leq 0.5b+0.5<1.0 \quad (1),$$

$$0\leq m\leq 1.0 \quad (2), \text{ and}$$

$$0.4\leq n\leq 0.7 \quad (3).$$

In accordance with embodiments of the present disclosure, it is possible to provide an aluminate fluorescent material having a high emission intensity through excitation by light having an emission spectrum in a range of 380 nm or more and 485 nm or less, a light emitting device using the same, and a method of producing an aluminate fluorescent material.

DETAILED DESCRIPTION

The aluminate fluorescent material, the light emitting device, and the production method for an aluminate fluorescent material of the present invention are described on a basis of the embodiments and examples. The embodiments shown below are exemplifications for exemplifying the technical idea of the present invention, and the present invention is not limited to the aluminate material, the light emitting device and the production method for an aluminate fluorescent material described below. The relationship between the color name and the chromaticity coordinate, and the relationship between the wavelength range of light and the color name of monochromatic light in accordance with JIS Z8110.

Aluminate Fluorescent Material

The aluminate fluorescent material of the first aspect of the present invention is an aluminate fluorescent material having a composition containing a first element that contains one or more elements selected from Ba and Sr, and a second element that contains Mg and Mn, wherein in the composition of the aluminate fluorescent material, when a molar ratio of Al is taken as 10, a total molar ratio of the first element is a value of a parameter a, a total molar ratio of the second element is a value of a parameter b, a molar ratio of Sr is a product of a value of a parameter m and the value of the parameter a, a molar ratio of Mn is a product of a value of a parameter n and the value of the parameter b, the values of the parameters a and b satisfy the following requirement (1), the value of the parameter m satisfies the following requirement (2), and the value of the parameter n satisfies the following requirement (3):

$0.5 < b < a \leq 0.5b + 0.5 < 1.0$ (1), $0 \leq m \leq 1.0$ (2), and $0.4 \leq n \leq 0.7$ (3).

In the composition of the aluminate fluorescent material, the value of the parameter a is a total molar ratio of Ba and Sr. In the composition of the aluminate fluorescent material, when the value of the parameter a is not a value satisfying the requirement (1), the crystal structure may be unstable and the emission intensity may lower. In the composition of the aluminate fluorescent material, the value of the parameter b is a total molar ratio of Mg and Mn. In the composition of the aluminate fluorescent material, when the value of the parameter b is 0.5 or less, the crystal structure may be unstable and the emission intensity may lower.

In the composition of the aluminate fluorescent material, the value of the parameter a and the value of the parameter b are preferably values satisfying the following requirement (4).

$0.7 < b < a \leq 0.5b + 0.5 < 1.0$ (4)

In the composition of the aluminate fluorescent material, when the value of the parameter b is a value of more than 0.7, the crystal structure of the aluminate fluorescent material can be stabilized more and the emission intensity of the aluminate fluorescent material can be higher.

In the composition of the aluminate fluorescent material, the value of the parameter m indicates the molar ratio of Sr when the total molar ratio of Ba and Sr of the first element is 1, and the first element may be all Ba or may be all Sr.

In the composition of the aluminate fluorescent material, the value of the parameter n indicates the molar ratio of Mn when the total molar ratio of Mg and Mn of the second element is 1. In the composition of the aluminate fluorescent material, when the value of the parameter n indicating the molar ratio of Mn among Mg and Mn of the second element is less than 0.4 or more than 0.7, the emission intensity through photoexcitation in a near UV to blue region may lower.

In the composition of the aluminate fluorescent material, the value of the parameter n is preferably a value satisfying a requirement of $0.4 \leq n \leq 0.6$.

In the composition of the aluminate fluorescent material, when the value of the parameter n is the value satisfying the requirement of $0.4 \leq n \leq 0.6$, the emission intensity may be increased more and the emission intensity of the aluminate fluorescent material through photoexcitation in a near UV to blue region can be higher.

In the composition of the aluminate fluorescent material, the product of the value of the parameter n indicating the molar ratio of Mn in the composition and the value of the parameter b (b×n) is preferably a value satisfying a requirement of $0.3 < b \times n < 0.6$.

For example, it is considered that the reason why the emission intensity through photoexcitation in a near-UV to blue region of the manganese-activated aluminate fluorescent material disclosed in Japanese Unexamined Patent Publication No. 2004-155907 is low would be because, as the emission characteristics of the fluorescent material, the absorbance of light in a near-UV to blue region is lower than the absorbance of vacuum UV rays. The aluminate fluorescent material of the first embodiment of the present disclosure is, when excited with light in a near-UV to blue region, able to absorb a larger amount of light in a near-UV to blue region and therefore can have an increased emission intensity since the activation amount by Mn is larger than the above-mentioned predetermined value. In addition, by reducing the Mn activation amount to be lower than the above-mentioned predetermined value, concentration quenching to be caused by too much activation could be prevented and therefore the emission intensity can be thereby increased.

Preferably, the aluminate fluorescent material has a composition represented by the following formula (I). The aluminate fluorescent material having a composition represented by the formula (I) has a high emission intensity and through photoexcitation in a near-UV to blue region, the emission intensity thereof can be higher.

$(Ba_{1-m}Sr_m)_a(Mg_{1-n}Mn_n)_bAl_{10}O_{15+a+b}$ (I)

wherein, a, b, m and n each are a number satisfying $0.5 < b < a \leq 0.5b + 0.5 < 1.0$, $0 \leq m \leq 1.0$, and $0.4 \leq n \leq 0.7$.

Regarding the aluminate fluorescent material of the first embodiment of the present disclosure, the half value width of the emission peak in the emission spectrum thereof, as excited with light in a near-UV to blue region, for example, with light having an emission peak wavelength of 450 nm, is preferably 45 nm or less, more preferably 40 nm or less, even more preferably 30 nm or less. As a fluorescent material capable of emitting green light by photoexcitation in a near-UV to blue region, for example, there is known a β-sialon fluorescent material excited by europium (Eu). The half value width of the emission peak in the emission spectrum of the β-sialon fluorescent material, when irradiated with light having an excitation wavelength of 450 nm, is 50 nm or so, that is, the half value width of the aluminate fluorescent material of the first embodiment of the present disclosure is narrower. The aluminate fluorescent material has a narrow half value width of the emission peak in the emission spectrum, and therefore has a high color purity. For example, when the light emitting device including the aluminate fluorescent material is used as a backlight for liquid crystals, the color reproducibility range can be broadened.

The aluminate fluorescent material of the first embodiment of the present disclosure is activated by manganese (Mn) and emits green light through photoexcitation in a near-UV to blue region. Specifically, the aluminate fluorescent material absorbs light falling within a wavelength range of 380 nm to 485 nm, and the emission peak wavelength in the emission spectrum thereof falls preferably in a range of 485 nm or more and 570 nm or less, more preferably in a range of 495 nm or more and 560 nm or less, even more preferably in a range of 505 nm or more and 550 nm or less.

Light Emitting Device

Figure 1:
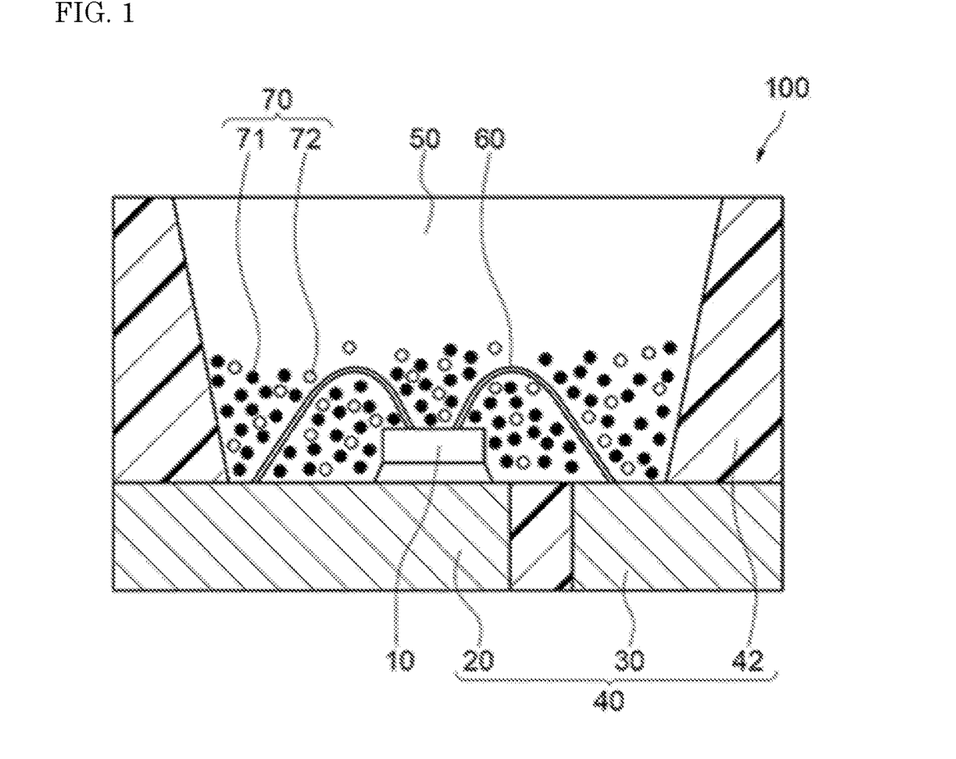
FIG. 1 is a schematic cross-sectional view showing one example of a light emitting device, according to an embodiment of the present disclosure.

One example of a light emitting device, which is the second embodiment of the present disclosure and which includes the aluminate fluorescent material of the first embodiment of the present disclosure, is described with reference to FIG. 1. FIG. 1 is a schematic cross-sectional view showing an example of a light emitting device 100 of an embodiment of the present disclosure.

The light emitting device 100 is provided with a molded article 40, a light emitting element 10 and a fluorescent member 50. The molded article 40 is integrally composed of a first lead 20, a second lead 30 and a resin part 42 containing a thermoplastic resin or a thermosetting resin. The molded article 40 forms a recess part having a bottom face and a side face, and the light emitting element 10 is mounted on the bottom face of the recess part. The light emitting element 10 has a pair of positive and negative electrodes, and the pair of positive and negative electrodes each are individually electrically connected to the first lead 20 and the second lead 30 each via a wire 60. The light emitting element 10 is covered with the fluorescent member 50. The fluorescent member 50 contains, for example, a fluorescent material 70 for wavelength conversion of the light from the light emitting element 10, and a resin. Further, the fluorescent material 70 contains a first fluorescent material 71 and a second fluorescent material 72. The first lead 20 and the second lead 30 connected to the pair of positive and negative electrodes of the light emitting element 10 are partly exposed toward the outside of the package to constitute the light emitting device 100. Via these first lead 20 and second lead 30, the light emitting device 100 receives external power to emit light.

The light emitting element 10 is used as an excitation light source, and preferably has an emission peak wavelength within a range of 380 nm or more and 485 nm or less. The range of the emission peak wavelength of the light emitting element 10 is preferably in a range of 390 nm or more and 480 nm or less, more preferably in a range of 420 nm or more and 470 nm or less. The aluminate fluorescent material of the first embodiment of the present disclosure is efficiently excited by the excitation light source having an emission spectrum within a range of 380 nm or more and 485 nm or less. Regarding the aluminate fluorescent material, in particular, the optical reflectance thereof from an excitation light source having an emission peak wavelength within a range of 420 nm or more and 470 nm or less is low, that is, the light absorptivity thereof is high and the aluminate fluorescent material can be efficiently excited by the light. The aluminate fluorescent material of the first embodiment of the present disclosure can be efficiently excited by the light from the excitation light source having an emission peak wavelength within the above-mentioned wavelength range, and using the aluminate fluorescent material having such a high emission intensity of the type, the light emitting device 100 that can emit mixed light of the light from the light emitting element 10 and the fluorescence from the fluorescent material 70 can be constructed.

The half value width of the emission spectrum of the light emitting element 10 is, for example, 30 nm or less.

Preferably, the light emitting element 10 uses a semiconductor light emitting element. Using the semiconductor light emitting element as a light source, a stable light emitting device having a high efficiency and a high linearity of output to input and having high mechanical impact resistance can be obtained.

Examples of the semiconductor light emitting element include a semiconductor light emitting element using a nitride semiconductor ($In_XAl_YGa_{1-X-Y}N$, $0 \leq X$, $0 \leq Y$, $X+Y \leq 1$).

The light emitting device 100 includes at least the aluminate fluorescent material of the first embodiment of the present disclosure, and preferably contains the aluminate fluorescent material having a composition represented by the formula (I).

The first fluorescent material 71 containing the aluminate fluorescent material of the first embodiment of the present disclosure can be contained, for example, in the fluorescent member 50 to cover the light emitting element 10, thereby constituting the light emitting device 100. In the light emitting device 100 in which the light emitting element 10 is covered by the fluorescent member 50 that contains the first fluorescent material 71 including the aluminate fluorescent material, a part of the light released from the light emitting element 10 is absorbed by the aluminate fluorescent material and is thereby emitted as green light. Using the light emitting element 10 that emits light having an emission spectrum within a wavelength in a range of 380 nm or more and 485 nm or less, especially emitting light having an emission spectrum within a wavelength in a range of 420 nm or more and 470 nm or less, the emitted light can be more effectively utilized. Accordingly, a light emitting device having a high emission efficiency can be provided.

The content of the first fluorescent material 71 is, for example, in a range of 1 part by mass or more and 50 parts by mass or less relative to the resin (100 parts by mass) and is preferably in a range of 2 parts by mass or more and 40 parts by mass or less.

Preferably, the fluorescent member 50 contains the second fluorescent material 72 whose emission peak wavelength differs from that of the first fluorescent material 71. For example, the light emitting device 100 is provided with the light emitting element 10 having an emission spectrum within a wavelength range of 380 nm or more and 485 nm or less, and especially emitting light having an emission peak wavelength within a range of 420 nm or more and 470 nm or less, and the first fluorescent material 71 containing the aluminate fluorescent material of the first embodiment of the present disclosure that is excited by the light, and optionally the second fluorescent material 72, and consequently, the light emitting device 100 can have a broad color reproducibility range and good color rendering properties.

The second fluorescent material 72 may be any one that absorbs light from the light emitting element 10 for wavelength conversion into light having a different wavelength of the first fluorescent material 71. Examples thereof include $(Ca, Sr, Ba)_2SiO_4$:Eu, $(Y, Gd, Lu)_3(Ga,Al)_5O_{12}$: Ce, $(Si,Al)_6(O,N)_8$:Eu, $SrGa_2S_4$:Eu, $K_2SiF_6$:Mn, $(Ba, Ca, Sr)_2Si_5N_8$:Eu, $CaAlSiN_3$:Eu, $(Ca, Sr)AlSiN_3$:Eu, $(Ca,Sr,Ba)_8MgSi_4O_{16}(F,Cl,Br)_2$:Eu, $(Y,La)_3Si_6N_{ii}$:Ce, $Ca_3Sc_2Si_3O_{12}$:Ce, $CaSc_4O_4$:Ce, etc.

In the case where the fluorescent member 50 further contains the second fluorescent material 72, the second fluorescent material 72 is preferably a red fluorescent material to emit a red color, and preferably absorbs light falling within a wavelength range of 380 nm or more and 485 nm or less, and emits light falling within a wavelength in a range of 610 nm or more and 780 nm or less. Containing the red fluorescent material, the light emitting device can be more favorably applied to lighting systems, liquid crystal display devices, etc.

The red fluorescent material includes a tetravalent Mn-activated fluoride fluorescent material having a compositional formula represented by $K_2SiF_6$:Mn, a divalent Eu-activated nitride fluorescent material represented by $CaSiAlN_3$:Eu, $(Ca,Sr)AlSiN_3$:Eu, $SrLiAl_3N_4$:Eu, etc. Among these, the red fluorescent material is, from the viewpoint of increasing the color purity and broadening the color reproducibility range, preferably a tetravalent Mn-activated fluoride fluorescent material of such that the half value width of the emission spectrum thereof is 20 nm or less.

The first fluorescent material 71 and the second fluorescent material 72 (the two may be simply referred to as "fluorescent material 70" as combined), along with a sealant material, constitute the fluorescent member 50 that covers the light emitting element 10. The sealant material to constitute the fluorescent member 50 includes a silicone resin, an epoxy resin, etc.

The total content of the fluorescent material 70 in the fluorescent member 50 may be, for example, in a range of 5 parts by mass or more and 300 parts by mass or less, relative to the resin (100 parts by mass), and is preferably in a range of 10 parts by mass or more and 250 parts by mass or less, even more preferably in a range of 15 parts by mass or more and 230 parts by mass or less, still more preferably in a range of 15 parts by mass or more and 200 parts by mass or less. When the total content of the fluorescent material 70 in the fluorescent member 50 falls within the range, the light emitted by the light emitting element 10 can be efficiently processed for wavelength conversion by the fluorescent material 70.

The fluorescent member 50 may further contain a filler, a light diffuser and the like in addition to the sealant material and the fluorescent material 70. For example, containing a light diffuser, the member can relieve the directionality from the light emitting element 10 and can therefore enlarge the viewing angle. Examples of the filler include silica, titanium oxide, zinc oxide, zirconium oxide, alumina, etc. In the case where the fluorescent member 50 contains a filler, the filler content may be, for example, in a range of 1 part by mass or more and 20 parts by mass or less relative to the resin (100 parts by mass).

Method of Producing an Aluminate Fluorescent Material

Next, as the third embodiment of the present disclosure, a method of producing the aluminate fluorescent material of the first embodiment of the present disclosure is described. The aluminate fluorescent material can be produced using compounds containing elements that constitute the composition of the aluminate fluorescent material.

Compound Containing Elements to Constitute Composition of Aluminate Fluorescent Material The compounds containing elements to constitute the composition of the aluminate fluorescent material include compounds containing aluminum (Al), compounds containing barium (Ba), optionally compounds containing strontium (Sr), compounds containing magnesium (Mg), and compounds containing manganese (Mn).

Aluminum-Containing Compounds

The aluminum-containing compounds include Al-containing oxides, hydroxides, nitrides, oxynitrides, fluorides, chlorides, etc. These compounds may be hydrates. As the aluminum-containing compound, an aluminum metal elementary substance or an aluminum alloy may also be used or the metal elementary substance or the alloy may be used for at least a part of the compounds to be used.

Specific examples of the Al-containing compounds include $Al_2O_3$, $Al(OH)_3$, AlN, AlON, $AlF_3$, $AlCl_3$, etc. One alone or two or more kinds of the Al-containing compounds may be used either singly or combined. The Al-containing compound is preferably an oxide ($Al_2O_3$). As compared with any other material, the oxide does not contain any other element than those of the intended composition of the aluminate fluorescent material, and can readily give the fluorescent material having a desired composition. In addition, in the case where a compound having any other element than those to be the intended composition is used, residual impurity elements may remain in the resultant fluorescent material, and the residual impurity elements may be killer factors against light emission and the emission intensity would be thereby noticeably lowered.

Barium-Containing Compound

The barium-containing compounds include Ba-containing oxides, hydroxides, carbonates, nitrates, sulfates, carboxylates, halides, nitrides, etc. These barium-containing compounds may be in the form of hydrates. Specific examples thereof include BaO, $Ba(OH)_2 \cdot 8H_2O$, $BaCO_3$, $Ba(NO_3)_2$, $BaSO_4$, $Ba(OCOH)_2 \cdot 2H_2O$, $Ba(OCOCH_3)_2$, $BaCl_2 \cdot 6H_2O$, $Ba_3N_2$, BaNH, etc. One alone or two or more kinds of the Ba-containing compounds may be used either singly or as combined. Among these, from the viewpoint of easiness in handling, carbonates and oxides are preferred. A Ba-containing carbonate ($BaCO_3$) is more preferred as it is stable in air, it can readily decompose by heating, any other element than those of the intended composition hardly remain, and it is easy to prevent emission intensity reduction owing to residual impurity elements.

Strontium-Containing Compound

The strontium-containing compounds include Sr containing oxides, hydroxides, carbonates, nitrates, sulfates, carboxylates, halides, nitrides, etc. These strontium-containing compounds may be in the form of hydrates. Specific examples thereof include SrO, $Sr(OH)_2 \cdot 8H_2O$, $SrCO_3$, $Sr(NO_3)_2 \cdot 4H_2O$, $SrSO_4$, $Sr(OCOH)_2 \cdot H_2O$, $Sr(OCOCH_3)_2 \cdot 0.5H_2O$, $SrCl_2 \cdot 6H_2O$, $Sr_3N_2$, SrNH, etc. One alone or two or more kinds of the Sr-containing compounds may be used either singly or as combined. Among these, from the viewpoint of easiness in handling, carbonates and oxides are preferred. A Sr-containing carbonate ($SrCO_3$) is more preferred as it is stable in air, it can readily decompose by heating, any other element than those of the intended composition hardly remain, and it is easy to prevent emission intensity reduction owing to residual impurity elements.

Magnesium-Containing Compounds

The magnesium-containing compounds include Mg-containing oxides, hydroxides, carbonates, nitrates, sulfates, carboxylates, halides, nitrides, etc. These magnesium-containing compounds may be in the form of hydrates. Specific examples thereof include MgO, Mg(OH)$_2$, 3MgCO$_3$.Mg(OH)$_2$.3H$_2$O, MgCO$_3$.Mg(OH)$_2$.2H$_2$O, Mg(NO$_3$)$_2$.6H$_2$O, MgSO$_4$, Mg(OCOH)$_2$.H$_2$O, Mg(OCOCH$_3$)$_2$.4H$_2$O, MgCl$_2$, Mg$_3$N$_2$, MgNH, etc. One alone or two or more kinds of the Mg-containing compounds may be used either singly or as combined. Among these, from the viewpoint of easiness in handling, carbonates and oxides are preferred. A Mg-containing oxide (MgO) is more preferred as it is stable in air, it can readily decompose by heating, any other element than those of the intended composition hardly remain, and it is easy to prevent emission intensity reduction owing to residual impurity elements.

Manganese-Containing Compound

The manganese-containing compounds include Mn-containing oxides, hydroxides, carbonates, nitrates, sulfates, carboxylates, halides, nitrides, etc. These manganese-containing compounds may be in the form of hydrates. Specific examples thereof include MnO$_2$, Mn$_2$O$_2$, Mn$_3$O$_4$, MnO, Mn(OH)$_2$, MnCO$_3$, Mn(NO$_3$)$_2$, Mn(OCOCH$_3$)$_2$.2H$_2$O, Mn(OCOCH$_3$)$_3$.2H$_2$O, MnCl$_2$.4H$_2$O, etc. One alone or two or more kinds of the Mn-containing compounds may be used either singly or as combined. Among these, from the viewpoint of easiness in handling, carbonates and oxides are preferred. A Mn-containing carbonate (MnCO$_3$) is more preferred as it is stable in air, it can readily decompose by heating, any other element than those of the intended composition hardly remain, and it is easy to prevent emission intensity reduction owing to residual impurity elements.

Mixing of Compounds

In the method of producing the aluminate fluorescent material of the third embodiment of the present disclosure, at least one or more kinds of compounds selected from Ba-containing compounds and Sr-containing compounds, a Mg-containing compound, a Mn-containing compound, and an Al-containing compounds are mixed in such a manner that the aluminate fluorescent material to be produced could have a composition where the molar ratio of Al is taken as 10, the total molar ratio of the first element containing one or more elements selected from Ba and Sr is a value of a parameter a, the total molar ratio of the second element containing Mg and Mn is a value of a parameter b, the molar ratio of Sr is a product of a value of a parameter m and the value of the parameter a, the molar ratio of Mn is a product of a value of a parameter n and the value of the parameter b, the values of the parameters a and b are values satisfying the following requirement (1), the value of the parameter m is a value satisfying the following requirement (2), and the value of the parameter n is a value satisfying the following requirement (3), thereby preparing a raw material mixture.

$$0.5<b<a\leq0.5b+0.5<1.0 \quad (1)$$

$$0\leq m\leq 1.0 \quad (2)$$

$$0.4\leq n\leq 0.7 \quad (3)$$

Preferably, the element-containing compounds are mixed in such a manner that the values of the parameters a and b could be values satisfying the following requirement (4).

$$0.7<b<a\leq0.5b+0.5<1.0 \quad (4)$$

When the value of the parameter b is larger than 0.7 and when the value of the parameters a and b are numbers satisfying the above requirement (4), the crystal structure of the aluminate fluorescent material can be stable and the emitting intensity of the resultant aluminate fluorescent material can be high.

Preferably, the value of the parameter n satisfies a requirement of $0.4\leq n\leq 0.6$, or the product of the value of the parameter b and the value of the parameter n (b×n) is a value satisfying a requirement of $0.3<b\times n<0.6$.

Accordingly, the Mn activation amount can fall within an optimum range, and light absorption in a near-UV to blue region contained in the excitation light source can be promoted, and consequently, concentration quenching to be caused by too much Mn activation can be prevented, the emission intensity can be increased, and the emission intensity through photoexcitation in a near UV to blue region can be further increased.

The raw material mixture may optionally contain a flux of halide or the like. In the raw material mixture containing a flux, reaction between the raw materials can be promoted and solid-phase reaction can go on more uniformly. This is because the temperature of heat treatment for the raw material mixture would be nearly the same as the liquid phase formation temperature for halides and the like to be used as the flux, or would be higher than the liquid phase formation temperature, and therefore the reaction could be promoted.

The halides includes fluorides, chlorides and others of rare earth metals, alkaline earth metals, alkali metals, etc. In the case where an alkaline earth metal halide is used as the flux, the flux may be added as the compound to provide the composition of the intended aluminate fluorescent material. Specific examples of the flux include barium fluoride (BaF$_2$), strontium fluoride (SrF$_2$), magnesium fluoride (MgF$_2$), aluminum fluoride (AlF$_3$), manganese fluoride (MnF$_2$), calcium fluoride (CaF$_2$), etc. Magnesium fluoride (MgF$_2$) is preferred. This is because, by using magnesium fluoride as the flux, the crystal structure is stabilized.

In the case where the raw material mixture contains the flux, the flux content is preferably 10% by mass or less, based on the raw material mixture (100% by mass), more preferably 5% by mass or less, and is preferably 0.1% by mass or more. When the flux content falls within the range, difficulty in formation of crystal structure owing to shortage of the flux to cause grain growth failure could be evaded, and difficulty in formation of crystal structure owing to excessive flux could also be evaded.

For the raw material mixture, the compounds each containing the intended element are weighed to be in a desired blending ratio, and then ground and mixed using, for example, a dry-process grinding machine such as a ball mill, a shaking mill, a hammer mill, a roll mill, a jet mill, or may be ground and mixed using a mortar and a pestle, etc. For example, the compounds may be mixed using a mixing machine such as a ribbon blender, a Henschel mixer, a V-shaped blender, or may be ground and mixed using both the dry-process grind machine and the mixing machine. The mixing may be dry-process mixing, or may also be wet-process mixing with a solvent added to the system. Dry-process mixing is preferred. This is because the processing time may be shortened more in dry-process mixing than in wet-process mixing, therefore leading to productivity improvement.

Heat Treatment of Raw Material Mixture

The raw material mixture may be heat-treated in a crucible, a boat formed of a carbonaceous material such as graphite or the like, or a material of boron nitride (BN), aluminum oxide (alumina), tungsten (W), molybdenum (Mo), etc.

The heat treatment temperature for the raw material mixture is, from the viewpoint of the stability of the crystal structure, preferably in a range of 1,000° C. or higher and 1,800° C. or lower, more preferably in a range of 1,100° C. or higher and 1,750° C. or lower, even more preferably in a range of 1,200° C. or higher and 1,700° C. or lower, especially more preferably in a range of 1,300° C. or higher and 1,650° C. or lower.

The heat treatment time differs depending on the heating speed, the heat treatment atmosphere and others. After the system has reached the heat treatment temperature, it is kept as such preferably for 1 hour or more, more preferably 2 hours or more, even more preferably 3 hours or more, and preferably 20 hours or less, more preferably 18 hours or less, even more preferably 15 hours or less.

The atmosphere for heat treatment for the raw material mixture may be an inert atmosphere of argon, nitrogen, a reductive atmosphere containing hydrogen, or an oxidative atmosphere such as air, etc. Preferably, the raw material mixture is heat-treated in a reductive nitrogen atmosphere to give a fluorescent material. More preferably, the atmosphere for heat treatment for the raw material mixture is a nitrogen atmosphere containing a reductive hydrogen gas.

For the aluminate fluorescent material, the raw material mixture can be more reactive in an atmosphere having a high reductive power such as a reductive atmosphere containing hydrogen and nitrogen, and can be heat-treated therein under an atmospheric pressure without pressurization. For the heat treatment, for example, an electric furnace, a gas furnace or the like may be used.

Post Treatment

The resultant fluorescent material may be post-treated for wet dispersion, wet-process sieving, dewatering, drying, dry-process sieving. According to such post treatment, a fluorescent material having a desired mean particle size can be obtained. For example, the fluorescent material after post treatment is dispersed in a solvent, then the dispersed fluorescent material is put on a sieve, and while a solvent flow is given thereto along with various shaking given thereto via the sieve, the baked product is led to pass through a mesh for wet-process sieving, and then dewatered, dried and dry-sieved to give a fluorescent material having a desired mean particle size.

By dispersing the fluorescent material after heat treatment in a medium, impurities such as baked residues of flux as well as unreacted components of the raw materials can be removed. For wet-process dispersing, dispersion media such as alumina balls, zirconia balls, and the like may be used.

EXAMPLES

The present invention is hereunder specifically described by reference to the following Examples and Comparative Examples.

Example 1

As raw materials, 36.6 g of $BaCO_3$ ($BaCO_3$ content: 99.3 mass %), 27.4 g of $SrCO_3$ ($SrCO_3$ content: 99.0 mass %), 204.9 g of $Al_2O_3$ ($Al_2O_3$ content: 99.5 mass %), 4.0 g of MgO (MgO content: 98.0 mass %), 24.7 g of $MnCO_3$ ($MnCO_3$ content: 94.8 mass %) were weighed so that the blending molar ratio could have a composition represented by $(Ba_{0.5}Sr_{0.5})_{0.92}(Mg_{0.4}Mn_{0.6})_{0.85}Al_{10}O_{16.77}$, and as a flux, 2.5 g of $MgF_2$ was added and dry-blended to give a raw material mixture. The resultant raw material mixture was filled in an alumina crucible and the crucible was closed with a lid, and in a mixed atmosphere of 3 vol % of $H_2$ and 97 vol % of $N_2$, heat treatment was performed at 1,500° C. for 5 hours to give an aluminate fluorescent material.

Example 2

An aluminate fluorescent material was obtained in the same manner as in Example 1 except that, as raw material, 37.8 g of $BaCO_3$, 28.4 g of $SrCO_3$, 205.6 g of $Al_2O_3$, 7.6 g of MgO and 18.1 g of $MnCO_3$ were weighed so that the blending molar ratio could have a composition represented by $(Ba_{0.5}Sr_{0.5})_{0.95}(Mg_{0.6}Mn_{0.4})_{0.93}Al_{10}O_{16.88}$, and as a flux, 2.5 g of $MgF_2$ was added.

Example 3

An aluminate fluorescent material was obtained in the same manner as in Example 1 except that, as raw material, 37.1 g of $BaCO_3$, 27.8 g of $SrCO_3$, 201.6 g of $Al_2O_3$, 4.4 g of MgO and 26.6 g of $MnCO_3$ were weighed so that the blending molar ratio could have a composition represented by $(Ba_{0.5}Sr_{0.5})_{0.95}(Mg_{0.4}Mn_{0.6})_{0.93}Al_{10}O_{16.88}$, and as a flux, 2.5 g of $MgF_2$ was added.

Example 4

An aluminate fluorescent material was obtained in the same manner as in Example 1 except that, as raw material, 37.2 g of $BaCO_3$, 27.9 g of $SrCO_3$, 208.6 g of $Al_2O_3$, 6.9 g of MgO and 16.8 g of $MnCO_3$ were weighed so that the blending molar ratio could have a composition represented by $(Ba_{0.5}Sr_{0.5})_{0.92}(Mg_{0.6}Mn_{0.4})_{0.85}Al_{10}O_{16.77}$, and as a flux, 2.5 g of $MgF_2$ was added.

Example 5

An aluminate fluorescent material was obtained in the same manner as in Example 1 except that, as raw material, 36.2 g of $BaCO_3$, 27.2 g of $SrCO_3$, 203.0 g of $Al_2O_3$, 2.5 g of MgO and 28.6 g of $MnCO_3$ were weighed so that the blending molar ratio could have a composition represented by $(Ba_{0.5}Sr_{0.5})_{0.92}(Mg_{0.3}Mn_0.O)_{0.85}Al_{10}O_{16.77}$, and as a flux, 2.5 g of $MgF_2$ was added.

Comparative Example 1

An aluminate fluorescent material was obtained in the same manner as in Example 1 except that, as raw material, 38.6 g of $BaCO_3$, 29.0 g of $SrCO_3$, 209.8 g of $Al_2O_3$, 10.9 g of MgO and 9.2 g of $MnCO_3$ were weighed so that the blending molar ratio could have a composition represented by $(Ba_{0.5}Sr_{0.5})_{0.95}(Mg_{0.8}Mn_{0.2})_{0.93}Al_{10}O_{16.88}$, and as a flux, 2.5 g of $MgF_2$ was added.

Comparative Example 2

An aluminate fluorescent material was obtained in the same manner as in Example 1 except that, as raw material, 38.3 g of $BaCO_3$, 28.8 g of $SrCO_3$, 197.7 g of $Al_2O_3$, 4.8 g of MgO and 28.1 g of $MnCO_3$ were weighed so that the blending molar ratio could have a composition represented by $(Ba_{0.5}Sr_{0.5})_{1.00}(Mg_{0.4}Mn_{0.6})_{1.00}Al_{10}O_{17.00}$, and as a flux, 2.4 g of $MgF_2$ was added.

Comparative Example 3

An aluminate fluorescent material was obtained in the same manner as in Example 1 except that, as raw material, 36.4 g of $BaCO_3$, 27.3 g of $SrCO_3$, 197.8 g of $Al_2O_3$, 1.4 g of MgO and 34.8 g of $MnCO_3$ were weighed so that the blending molar ratio could have a composition represented by $(Ba_{0.5}Sr_{0.5})_{0.95}(Mg_{0.2}Mn_{0.8})_{0.93}Al_{10}O_{16.88}$, and as a flux, 2.4 g of $MgF_2$ was added.

Evaluation of Emission Characteristics
Relative Emission Intensity (%)

Figure 2:
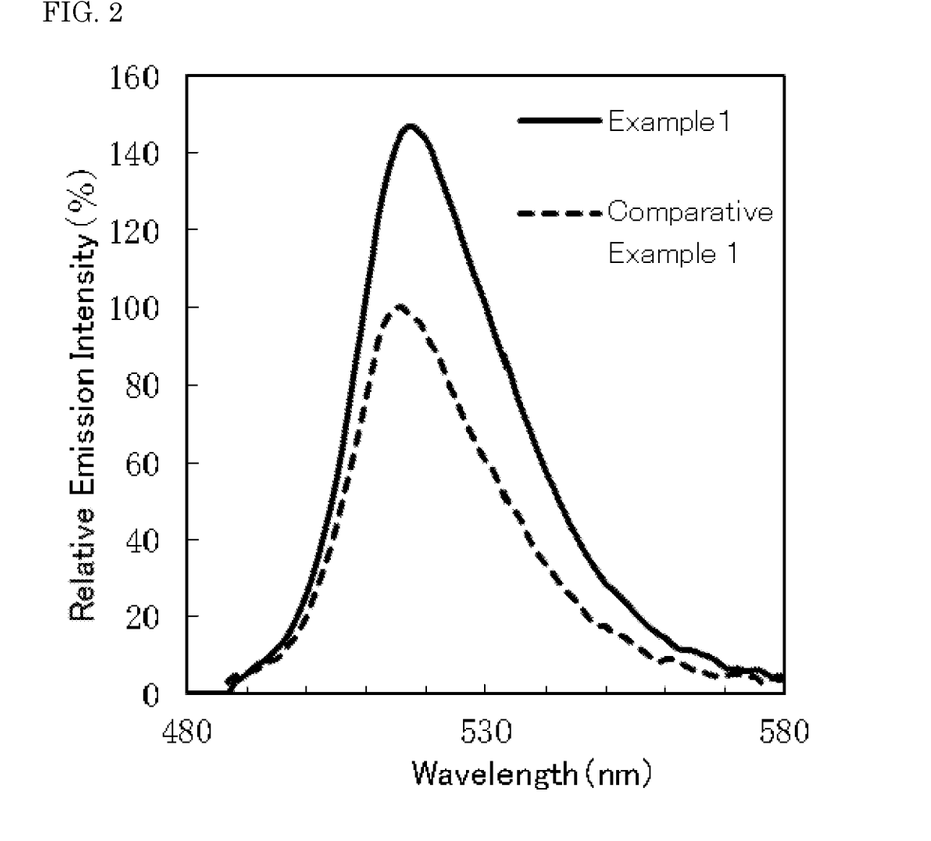
FIG. 2 is a diagram showing light emission spectra of the aluminate fluorescent materials according to an example of an embodiment of the present disclosure and a comparative example.

The emission characteristics of the fluorescent materials of Examples and Comparative Examples were measured. Using a quantum efficiency measurement system (QE-2000 manufactured by Otsuka Electronics Co., Ltd.), each fluorescent material was irradiated with light having an excitation wavelength of 450 nm to measure the emission spectrum thereof at room temperature (25° C.±5° C.). The emission intensity (%) of the resultant emission spectrum was determined. The relative emission intensity was calculated based on the emission intensity 100% of the fluorescent material of Comparative Example 1. The results are shown in Table 1. FIG. 2 shows the emission spectrum of the relative emission intensity (%) to wavelength of the aluminate fluorescent materials of Example 1 and Comparative Example 1.

Half Value Width: FWHM

The half value width (FWHM) of the resultant emission spectrum of the fluorescent material of Examples and Comparative Examples was measured. The results are shown in Table 1.

Emission Peak Wavelength

The wavelength at which the resultant emission spectrum of the fluorescent material of each of the Examples and Comparative Examples was at a maximum was determined as an emission peak wavelength (nm). The results are shown in Table 1.

Reflectance (%)

Figure 3:
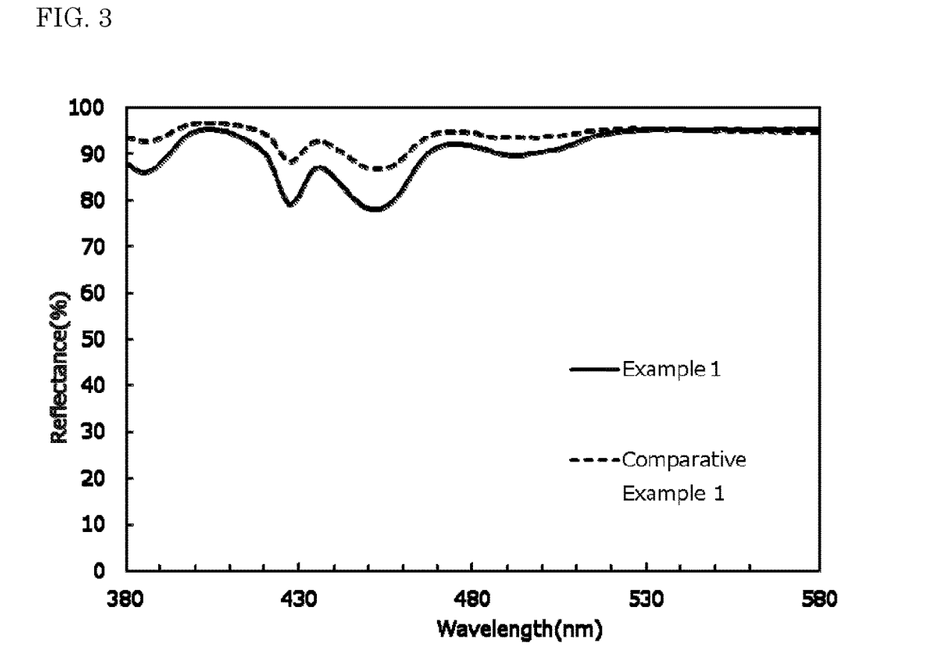
FIG. 3 is a diagram showing reflection spectra of the aluminate fluorescent materials according to the example of an embodiment of the present disclosure and the comparative example.

Using a spectral fluorophotometer (F-4500 manufactured by Hitachi High-technologies Corporation), a sample of the fluorescent material of Examples and Comparative Examples was irradiated with light from an excitation light source, halogen lamp at room temperature (25° C.±5° C.), and the wavelength of the spectroscope on the excitation side and the fluorescence side was scanned as combined to measure the reflected light. The proportion of the reflected light relative to the light having an excitation wavelength of 450 nm is shown in Table 1 as a reflectance (%) based on the reflectance of $CaHPO_4$. In addition, the reflectance to wavelength of the fluorescent material of Example 1 and the fluorescent material of Comparative Example 1 is shown in FIG. 3 as a reflection spectrum thereof.

TABLE 1

| | Compositional Ratio | a | b | m | n | b × n | Relative Emission Intensity (%) | Emission Peak Wavelength (nm) | FWHM (nm) | 450 nm Reflectance (%) |
|---|---|---|---|---|---|---|---|---|---|---|
| Example 1 | $(Ba_{0.5}Sr_{0.5})_{0.92}(Mg_{0.4}Mn_{0.6})_{0.85}Al_{10}O_{16.77}$ | 0.92 | 0.85 | 0.5 | 0.6 | 0.510 | 152 | 518 | 29 | 78.3 |
| Example 2 | $(Ba_{0.5}Sr_{0.5})_{0.95}(Mg_{0.6}Mn_{0.4})_{0.93}Al_{10}O_{16.88}$ | 0.95 | 0.93 | 0.5 | 0.4 | 0.372 | 141 | 517 | 28 | 79.9 |
| Example 3 | $(Ba_{0.5}Sr_{0.5})_{0.95}(Mg_{0.4}Mn_{0.6})_{0.93}Al_{10}O_{16.88}$ | 0.95 | 0.93 | 0.5 | 0.6 | 0.558 | 135 | 518 | 29 | 76.6 |
| Example 4 | $(Ba_{0.5}Sr_{0.5})_{0.92}(Mg_{0.6}Mn_{0.4})_{0.85}Al_{10}O_{16.77}$ | 0.92 | 0.85 | 0.5 | 0.4 | 0.340 | 135 | 517 | 29 | 79.8 |
| Example 5 | $(Ba_{0.5}Sr_{0.5})_{0.92}(Mg_{0.3}Mn_{0.7})_{0.85}Al_{10}O_{16.77}$ | 0.92 | 0.85 | 0.5 | 0.7 | 0.595 | 111 | 517 | 29 | 76.9 |
| Comparative Example 1 | $(Ba_{0.5}Sr_{0.5})_{0.95}(Mg_{0.8}Mn_{0.2})_{0.93}Al_{10}O_{16.88}$ | 0.95 | 0.93 | 0.5 | 0.2 | 0.186 | 100 | 516 | 28 | 86.9 |
| Comparative Example 2 | $(Ba_{0.5}Sr_{0.5})_{1.00}(Mg_{0.4}Mn_{0.6})_{1.00}Al_{10}O_{17.00}$ | 1.00 | 1.00 | 0.5 | 0.6 | 0.600 | 84 | 517 | 29 | 75.6 |
| Comparative Example 3 | $(Ba_{0.5}Sr_{0.5})_{0.95}(Mg_{0.2}Mn_{0.8})_{0.93}Al_{10}O_{16.88}$ | 0.95 | 0.93 | 0.5 | 0.8 | 0.744 | 13 | 518 | 29 | 75.2 |

As shown in Table 1, in the compositions of the aluminate fluorescent materials of Examples 1 to 5, the value of the parameters a, b, m and n satisfies the requirements (1) to (3) when the molar ratio Al is taken as 10. The aluminate fluorescent materials of these Examples 1 to 5 had a higher relative emission intensity owing to excitation of blue light having an emission peak wavelength of 450 nm, than those of Comparative Examples 1 to 3. In particular, in the aluminate fluorescent materials of Examples 1 to 4, the value of the parameter n indicating the molar ratio of Mn in the second element (Mg and Mn) satisfies 0.4≤n≤0.6, and the product of the value of the parameter n indicating the molar ratio of Mn and the value of the parameter b (b×n) satisfies the requirement of 0.3<b×n<0.6, when the molar ratio Al is taken as 10, and therefore the relative emission intensity of the aluminate fluorescent materials was 135% or more and was extremely high owing to excitation of blue light having an emission peak wavelength of 450 nm. In addition, as also shown in Table 1, the reflectance of the aluminate fluorescent materials of Examples 1 to 5 to the excitation light, blue light having an emission peak wavelength of 450 nm was 80% or less and was low. From these results, it is confirmed that the aluminate fluorescent materials of Examples 1 to 5 greatly absorb a part of the excitation light, blue light having an emission peak wavelength of 450 nm, and emits fluorescence at a high emission intensity.

As shown in Table 1, in the composition of the aluminate fluorescent material of Comparative Example 1, the value of the parameter n indicating the molar ratio of Mn in the second element (Mg and Mn) did not satisfy the requirement (3), 0.4≤n≤0.7. In Comparative Example 1, the reflectance was more than 80%, and was higher than the reflectance of the aluminate fluorescent materials of Examples 1 to 5, in other words, the absorbance of the excitation light having an emission peak wavelength of 450 nm of the former was small and the relative emission intensity of the former was lower than that of the aluminate fluorescent materials of Examples 1 to 5.

Also as shown in Table 1, in the composition of the aluminate fluorescent material of Comparative Example 2, the value of the parameter a indicating the total molar ratio of the first element (Ba, Sr) was equal to the value of the parameter b indicating the total molar ratio of the second element (Mg and Mn), and did not satisfy the requirement (1). In Comparative Example 2, the relative emission intensity was low.

Also as shown in Table 1, in the composition of the aluminate fluorescent material of Comparative Example 3, the value of the parameter n indicating the molar ratio of Mn in the second element (Mg and Mn) did not satisfy the requirement (3), 0.4≤n≤0.7, and the value of the parameter n was larger than the upper limit, 0.7. In Comparative Example 3, the relative emission intensity was 13% and was extremely low.

In the compositions of the aluminate fluorescent materials of Comparative Examples 1 to 3, the product of the value of the parameter n indicating the molar ratio of Mn and the value of the parameter b (b×n) did not satisfy the requirement of 0.3<b×n<0.6.

In addition, as shown in Table 1, the half value width of the emission peak in the emission spectrum of the aluminate fluorescent materials of Examples 1 to 5 was less than 30 nm and was narrow.

As shown in Table 1 and FIG. 2, the aluminate fluorescent materials of Examples 1 to 5 emitted light whose emission peak wavelength falls within a range of 516 nm to 518 nm, through excitation of blue light having an emission peak intensity of 450 nm. As shown in the emission spectrum in FIG. 2, the relative emission intensity at the emission peak wavelength of the aluminate fluorescent material of Example 1 was higher than the relative emission intensity of Comparative Example 1.

Also as shown in FIG. 3, the reflection spectrum within a range of 420 nm or more and 470 nm or less of the aluminate fluorescent material of Example 1 was lower than the reflection spectrum within the same range of the aluminate fluorescent material of Comparative Example 1, and in particular, the absorption of excitation light having a wavelength of 420 nm or more and 470 nm or less of the former is high, and it is confirmed that the aluminate fluorescent material of Example 1 absorbed the excitation light falling within the wavelength range and emitted fluorescence at a high emission intensity.

In accordance with an embodiment of the present invention, it is possible to provide an aluminate fluorescent material having a high emission intensity as a green emitting fluorescent material that is excited with light falling in a near-UV to blue region. The light emitting device using the aluminate fluorescent material can be used in a wide range of fields of general lighting, in-car lighting, displays, backlights for liquid crystals, traffic lights, lighting switches, etc. The aluminate fluorescent material of one embodiment of the present disclosure has a high emission intensity, has a narrow half value width of an emission peak and has a high color purity, and therefore can broaden the color reproducibility range, and is favorably usable as a backlight source for liquid crystals.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising an aluminate fluorescent material; and an excitation light source, the aluminate fluorescent material comprising:

a first element that contains one or more elements selected from Ba and Sr; and a second element that contains Mg and Mn, wherein in a composition of the aluminate fluorescent material, when a molar ratio of Al is taken as 10, a total molar ratio of the first element is a value of a parameter a, a total molar ratio of the second element is a value of a parameter b, a molar ratio of Sr is a product of a value of a parameter m and the value of the parameter a, a molar ratio of Mn is a product of a value of a parameter n and the value of the parameter b, and the values of the parameters a and b satisfy the following requirement (1), the value of the parameter m satisfies the following requirement (2), and the value of the parameter n satisfies the following requirement (3):

$0.5 < b < a \leq 0.5b + 0.5 < 1.0$ (1), $0 \leq m \leq 1.0$ (2), and $0.4 \leq n \leq 0.7$ (3); and the excitation light source has an emission spectrum within a range of 380 nm or more and 485 nm or less.

2. The light emitting device according to claim 1, wherein the values of the parameters a and b satisfy the following requirement (4):

$$0.7 < b < a \leq 0.5b + 0.5 < 1.0 \qquad (4).$$

3. The light emitting device according to claim 1, wherein the composition is represented by the following formula (I):

$$(Ba_{1-m}Sr_m)_a(Mg_{1-n}Mn_n)_b Al_{10}O_{15+a+b} \qquad (I).$$

4. The light emitting device according to claim 3, wherein the values of the parameters a and b satisfy $0.7 < b < a \leq 0.5b + 0.5 < 1.0$.

5. The light emitting device according to claim 1, wherein the excitation light source has an emission peak wavelength within a range of 420 nm or more and 470 nm or less.

\* \* \* \* \*